US011728184B2

United States Patent
Tamura (10) Patent No.: US 11,728,184 B2
(45) Date of Patent: Aug. 15, 2023

(54) DRYING MODULE, SUBSTRATE PROCESSING MODULE AND METHOD OF DRYING SUBSTRATE HOLDER

(71) Applicant: EBARA CORPORATION, Tokyo (JP)

(72) Inventor: Sho Tamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 196 days.

(21) Appl. No.: 17/150,893

(22) Filed: Jan. 15, 2021

(65) Prior Publication Data

US 2021/0242040 A1   Aug. 5, 2021

(30) Foreign Application Priority Data

Feb. 3, 2020   (JP) ................................ 2020-016263

(51) Int. Cl.
*H01L 21/67* (2006.01)
(52) U.S. Cl.
CPC .. *H01L 21/67034* (2013.01); *H01L 21/67051* (2013.01)
(58) Field of Classification Search
CPC ................ H01L 21/67051; H01L 21/67034
See application file for complete search history.

(56) References Cited

U.S. PATENT DOCUMENTS

| 2002/0053355 A1* | 5/2002 | Kamikawa | ........ H01L 21/67051 134/33 |
| 2007/0277930 A1* | 12/2007 | Yokoyama | ........ H01L 21/67051 156/345.31 |
| 2018/0291521 A1* | 10/2018 | Tsuji | ........................ B08B 3/08 |

FOREIGN PATENT DOCUMENTS

JP   2013-201172 A   10/2013

* cited by examiner

*Primary Examiner* — Benjamin L Osterhout
(74) *Attorney, Agent, or Firm* — BakerHostetler (57) ABSTRACT

A drying module 300 according to the present disclosure includes a drying tank 320 having a wall 322, a liquid supply port 334 for supplying liquid to an inner surface of the wall 322 and an outlet 336, a plurality of nozzles 340 for spraying a gas to a substrate holder 200, a liquid supply system 312 which supplies the liquid from the liquid supply port 334 to the inside of the drying tank 320, a gas supply system 310 which supplies the gas to the plurality of nozzles 340, and a control module 380. The control module 380 controls the liquid supply system 312 and the gas supply system 310 such that the plurality of nozzles 340 sprays the gas to the substrate holder 200 or a substrate W while the liquid supply port 334 supplies the liquid to the inner surface of the wall 322.

19 Claims, 7 Drawing Sheets

DRYING MODULE, SUBSTRATE PROCESSING MODULE AND METHOD OF DRYING SUBSTRATE HOLDER

CROSS-REFERENCE TO RELATED APPLICATION

This application is based upon and claims benefit of priority from Japanese Patent Application No, 2020-016263 filed on Feb. 3, 2020, the entire contents of which are incorporated herein by reference.

TECHNICAL FIELD

The present invention relates to a drying module, a substrate processing module and a method of drying a substrate holder.

BACKGROUND ART

To form a metallic thin film on a surface of a substrate, a plating apparatus is used. The plating apparatus may include a substrate drying module. In such plating apparatus, after plate processing is executed to the surface of the substrate held by a substrate holder, the substrate is cleansed. After that, the substrate is dried by the substrate drying module.

Figure 7:
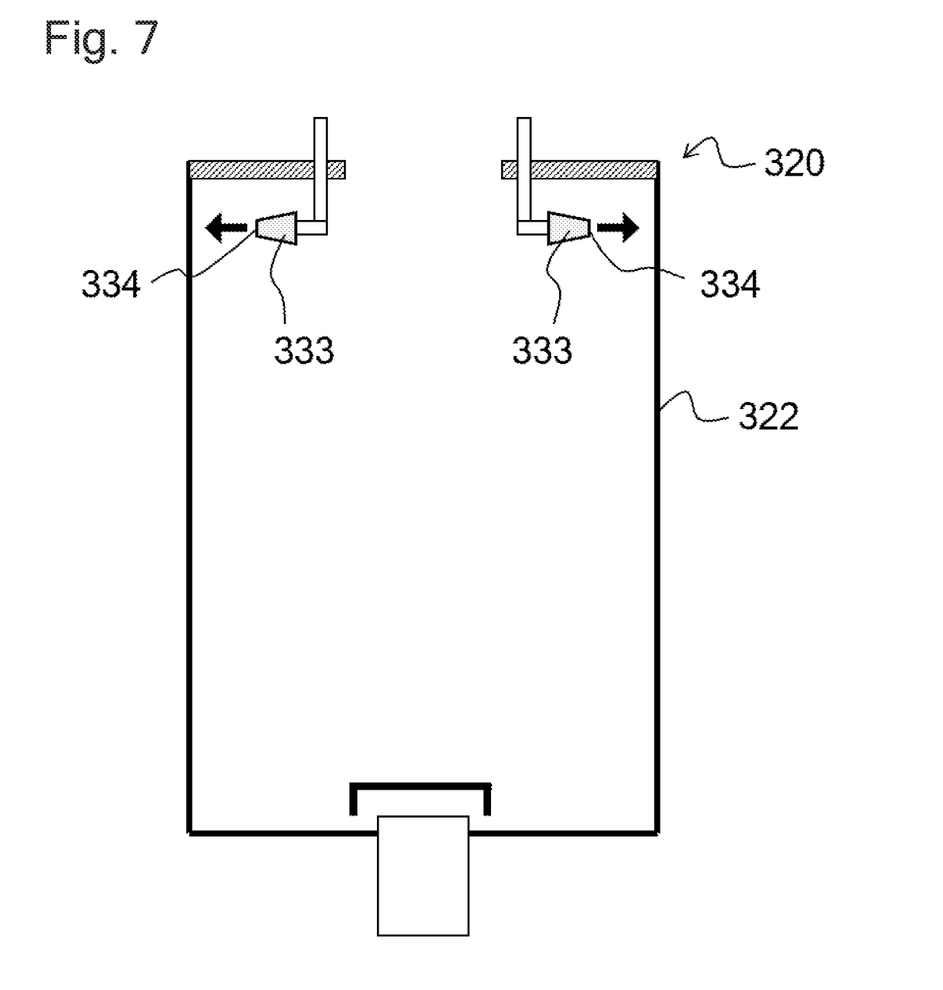
FIG. 7 is a cross-sectional view showing an inside of a drying tank of a drying module according to another embodiment, which is different from the drying module shown in FIG. 2.

An example of the substrate drying module is disclosed in JP2013201172A (PTL 1). JP2013201172A discloses, as shown in FIG. 7, a substrate diving module including a drying tank and a plurality of spraying nozzles located in an inside of the drying tank. Moreover, in this substrate drying module, the plurality of spraying nozzles are configured such that they are located at a position facing a substrate to spray a dry gas such as an N2 gas or air toward a surface of the substrate.

According to the substrate drying module disclosed in JP2013201172A, the dry gas such as an N2 gas or air is sequentially sprayed from the spraying nozzles in the inside of the drying tank toward the surface of the substrate held by a substrate holder. Due to this, this substrate drying module can remove water drops attached to the surface of the substrate and execute drying.

CITATION LIST

Patent Literature

PTL 1: JP2013201172A

SUMMARY OF INVENTION

Technical Problem

As described above, in the substrate drying module disclosed in JP2013201172A, the spraying nozzles spray the dry gas toward the substrate, thereby drying the substrate. Moreover, since the dry gas sprayed to the substrate is splashed also to the substrate holder holding the substrate, the substrate drying module also dries the substrate holder. At this time, when particles are attached to the substrate or the substrate holder, due to the sprayed dry gas, the particles fly. Moreover, the flying particles are attached to an inner surface of the drying tank, which may cause contamination of the inside of the drying tank. Also, in a case where the spraying nozzles are used in the inside of the contaminated drying tank, the particles attached to the inner surface of the drying tank may fly again to be attached to another substrate or substrate holder.

In view of the problem, an object of the present disclosure is to provide a drying module, a substrate processing module and a method of drying a substrate holder enabling removal of the particles floating in the inside of the drying tank when the substrate holder is dried and inhibiting that the particles attached to the inner surface of the drying tank fly again and to be attached another substrate or substrate holder.

Solution to Problem

A drying module according to one embodiment is a drying module for drying a substrate holder, the drying module including: a drying tank configured to house the substrate holder and having a wall and an outlet which discharges liquid in an inside of the drying tank; a liquid supply port for supplying the liquid to an inner surface of the wall; a plurality of nozzles which are located in the inside of the drying tank to spray a gas to the substrate holder housed in the drying tank; a liquid supply system which supplies the liquid from the liquid supply port to the inside of the drying tank; a gas supply system which supplies the gas to the plurality of nozzles; and a control module, wherein the control module controls the liquid supply system and the gas supply system such that the plurality of nozzles spray the gas to the substrate holder or a substrate while the liquid supply port supplies the liquid to the inner surface of the wall.

According to the drying module according to this embodiment, the control module controls the liquid supply system and the gas supply system such that the plurality of nozzles spray the gas to the substrate holder while the liquid supply port supplies the liquid to the inner surface of the wall. In other words, such a state is inevitably achieved that the liquid is supplied from the liquid supply port to the inner surface of the wall of the inside of the drying tank when the plurality of nozzles spray the gas to the substrate holder. The liquid can capture the particles floating in the gas by contacting the gas in the inside of the drying tank, which inhibits contamination of the inside of the drying tank. In other words, in the drying module according to this embodiment, the particles floating in the inside of the drying tank can be removed when the substrate holder is dried, which can inhibit that the particles attached to the inner surface of the drying tank fly again to be attached to another substrate or the substrate holder.

A method of drying a substrate holder according to one embodiment is a method of drying a substrate holder, the method including: a step of spraying gas to a substrate holder housed in a drying tank by a plurality of nozzles; and a step of supplying liquid to an inner surface of a wall in an inside of the drying tank from a liquid supply port, wherein the step of spraying is executed while the step of supplying liquid is executed.

According to the method of drying the substrate holder according to this embodiment, the step of spraying is executed while the step of supplying liquid is executed. In other words, such a state is inevitably achieved that the liquid is supplied from the liquid supply port to the inner surface of the wall of the inside of the drying tank when the plurality of nozzles spray the gas to the substrate holder. The liquid can capture the particles floating in the gas by contacting the gas in the inside of the drying tank, which inhibits contamination of the inside of the drying tank. In other words, in the method of drying the substrate holder according to this embodiment, the particles floating in the inside of the drying tank can be removed when the substrate holder is dried, which can inhibit that the particles attached to the inner surface of the drying tank fly again to be attached to another substrate or the substrate holder.

DESCRIPTION OF EMBODIMENTS

Hereinafter, an embodiment according to this disclosure will be explained with reference to the drawings, Additionally, in the drawings explained below, the identical or corresponding constituent elements are applied the same reference numeral and a duplicate explanation is omitted.

Figure 1:
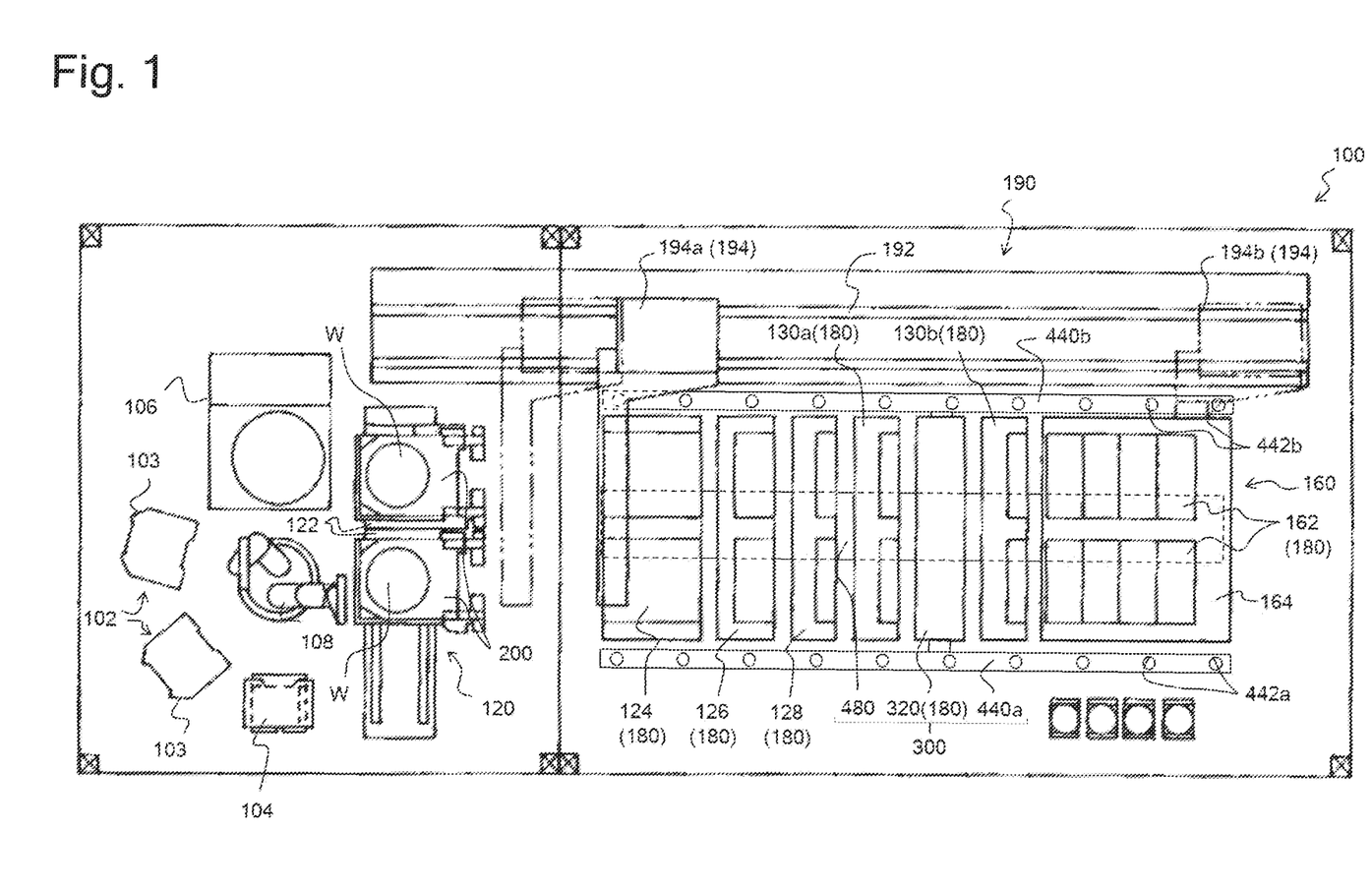
FIG. 1 is an entire arrangement drawing of a plating apparatus including a drying module according to a first embodiment.

FIG. 1 is an entire arrangement drawing of a plating apparatus 100 including a drying module 300 according to this embodiment. With reference to FIG. 1, the plating apparatus 100 includes two cassette tables 102, an aligner 104, a spin rinse dryer 106, a substrate transporter 108 and a load/unload station 120. The plating apparatus 100 is, as one example, a wet type vertical electroplating apparatus. The plating apparatus 100 is an example of a substrate processing module.

First, each constituent element of the plating apparatus 100 will be explained. Each cassette table 102 has a function of mounting a cassette 103 housing a substrate W such as a semiconductor wafer. The spin rinse dryer 106 has a function of rapidly rotating the substrate W after plate processing for drying. The load/unload station 120 has two mounting plates 122. At the load/unload station 120, loading and unloading of the substrate W to/from a substrate holder 200 mounted on the mounting plates 122 is executed.

The substrate transporter 108 is arranged at the center of the cassette tables 102, the aligner 104, the spin rinse dryer 106 and the load/unload station 120. The substrate transporter 108 has a function of transfer the substrate W among the cassette tables 102, the aligner 104, the spin rinse dryer 106 and the load/unload station 120. The substrate transporter 108 is, as one example, constituted by a transfer robot.

The plating apparatus 100 further includes a stocker 124, a pre-wet module 126, a pre-soak module 128, a first cleaner 130a, a drying module 300, a second cleaner 130b and a plating module 160. Additionally, while the plating apparatus 100 includes the drying module 300 in this embodiment, in another embodiment according to the present disclosure, substrate processing modules other than the plating apparatus 100 such as an etching apparatus and a cleaning apparatus may include the drying module 300.

At the stocker 124, a substrate holder 200 is stored and temporarily located. The pre-wet module 126 retains pure water. In the pre-wet module 126, the substrate W is soaked in pure water and a surface of the substrate W is wet, so that hydrophilic property of the substrate W is improved. The pre-soak module 128 retains sulfuric acid. The pre-soak module 128 has a function of executing etching removal of an oxide film on a surface of a conductive layer such as a seed layer formed on the surface of the substrate W by sulfuric acid. The first cleaner 130a retains cleaning liquid (pure water etc.) The first cleaner 130a can cleanse the pre-soaked substrate W together with the substrate holder 200 by the cleaning liquid (pure water etc.) The drying module 300 includes a drying tank 320 and has a function of executing liquid draining of the substrate W and the substrate holder 200 after cleaning. Additionally, the detailed configuration of the drying module 300 will be explained later. The second cleaner 130b has a function of cleaning the substrate W and the substrate holder 200 after plating by the cleaning liquid.

The plating module 160 includes, as one example, a plurality of adjacent plating tanks 162 and an overflow tank 164 surrounding the plurality of plating tanks 162. As one example, each plating tank 162 has a function of housing one substrate W in its inside. In each plating tank 162, the substrate W is soaked in plating liquid retained in the inside of the plating tank 162, whereby plating such as copper plating is applied to the surface of the substrate W. Additionally, the pre-wet module 126, the pre-soak module 128, the first cleaner 130a, the drying tank 320, the second cleaner 130b and the plating tank 162 can be referred to as a processing tank 180. In other words, the processing tank 180 is a tank for processing the substrate W.

The plating apparatus 100 further includes a transfer system 190. Moreover, the transfer system 190 includes a horizontal rail 192, a first transporter 194a and a second transporter 194b. Additionally, the first transporter 194a and the second transporter 194b have the same structure, and each of them can be simply referred to as a transporter 194. The transfer system 190 is located at a side of the load/unload station 120, the stocker 124, the pre-wet module 126, the pre-soak module 128, the first cleaner 130a, the drying tank 320, the second cleaner 130b and the plating module 160 which are aligned in a straight line. The transfer system 190, as one example, adopts a linear motor method. The horizontal rail 192 is adjacent to each processing tank 180 aligned in the straight line and extends straightly.

As one example, the first transporter 194a is configured to transfer the substrate holder 200 among the load/unload station 120, the stocker 124, the pre-wet module 126, the pre-soak module 128, the first cleaner 130a and the drying tank 320. As one example, the second transporter 194b is configured to transfer the substrate holder 200 among the first cleaner 130a, the second cleaner 130b, the drying tank 320 and the plating tank 162.

Figure 2:
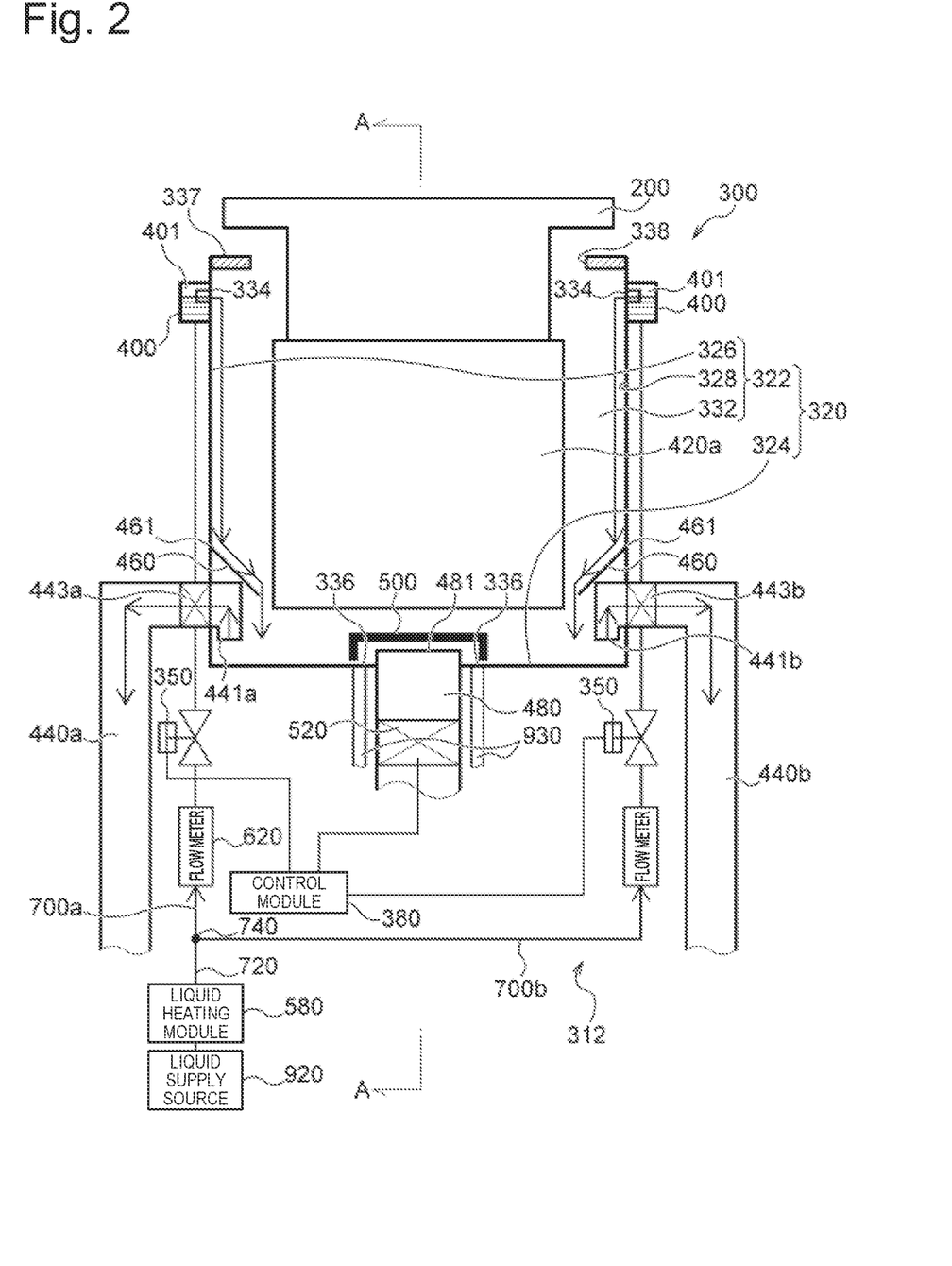
FIG. 2 is a schematic drawing of the drying module according to the first embodiment.
Figure 3:
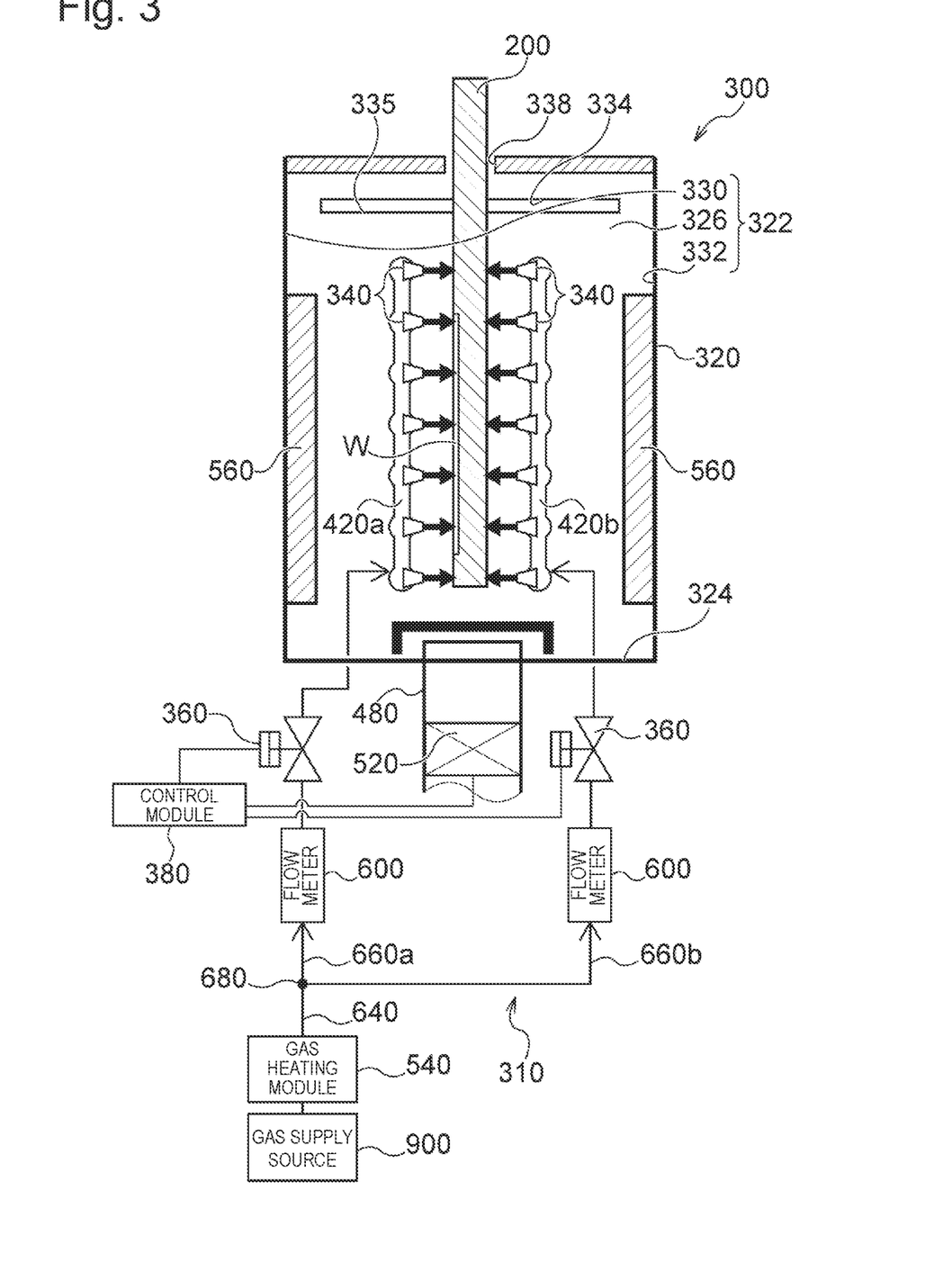
FIG. 3 is a cross-sectional view taken along the line A-A of FIG. 2.

Next, the drying module 300 illustrated in FIG. 1 will be explained in detail. FIG. 2 is a schematic drawing of the drying module 300 illustrated in FIG. 1, and FIG. 3 is a cross-sectional view taken along the line A-A of FIG. 2. Also, FIG. 4 is a cross-sectional perspective view illustrating an inside of the drying module 300, and FIG. 5 is another cross-sectional perspective view illustrating the inside of the drying module 300.

With reference to FIG. 2, as one example, the drying module 300 includes the drying tank 320 having a rectangular box shape. The drying tank 320 has a function of housing the substrate holder 200. Also, the drying tank 320 has a wall 322 and a bottom surface 324. The wall 322 includes four wall surfaces 326, 328, 330, 332 forming a rectangular shape in a top view (see FIGS. 2 and 3). Also, the drying tank 320 includes an upper surface 337 formed with a rectangular opening 338 for housing the substrate holder 200 in an inside of the drying tank 320 (see FIGS. 2 and 4). Consequently, the substrate holder 200 transferred in a state of being suspended from the transporter 194 can enter the inside of the drying tank 320 from the opening 338. At this time, as one example, as illustrated in FIG. 2, only a portion requiring drying of the substrate holder 200 and the substrate W is inserted in the inside of the drying tank 320. Due to this, the drying module 300 can dry the portion requiring drying in the inside of the drying tank 320. Additionally, in another embodiment according to the present disclosure, the entire substrate holder 200 may be inserted into the inside of the drying tank 320 from the opening 338.

Figure 4:
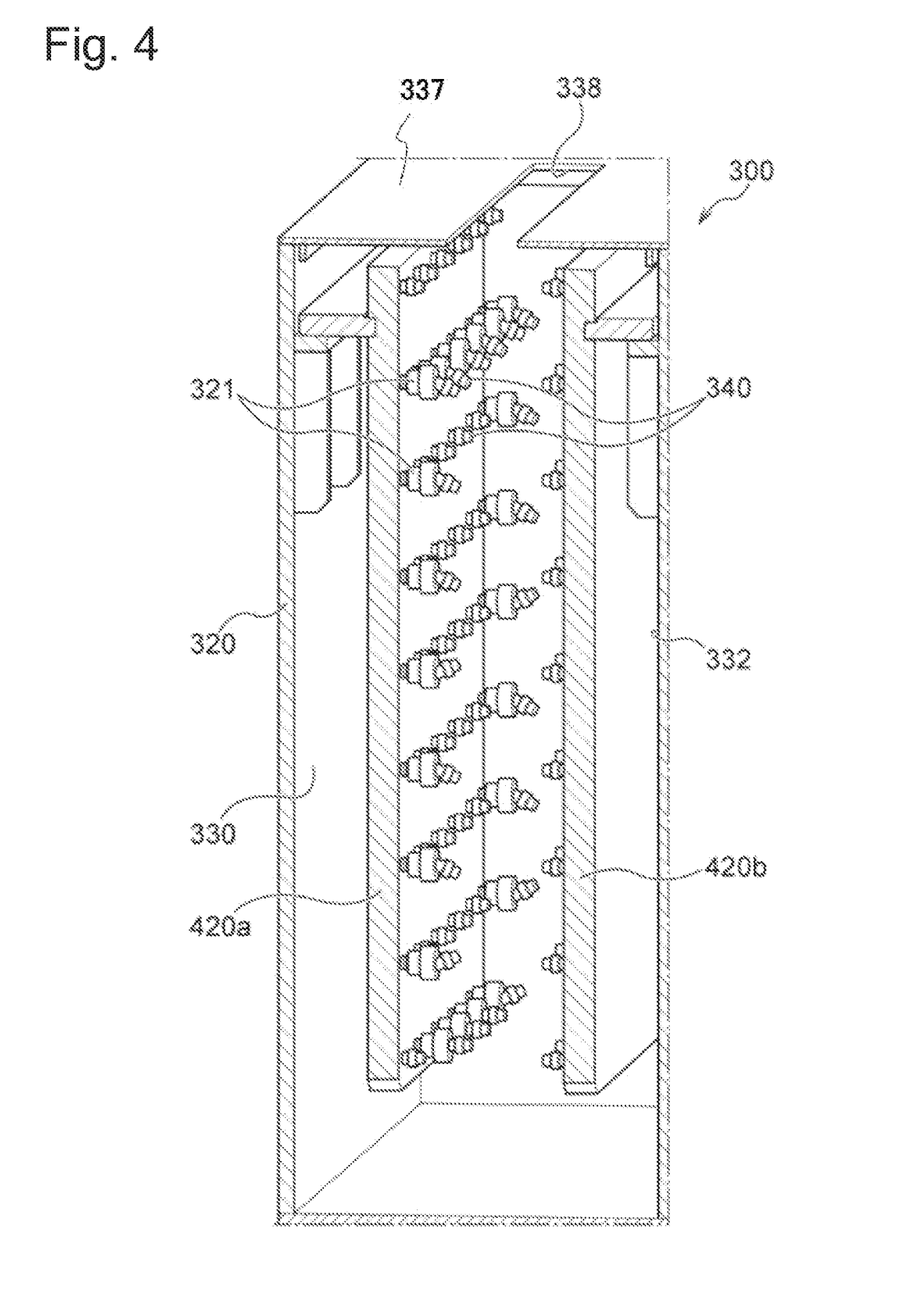
FIG. 4 is a cross-sectional perspective view illustrating an inside of the drying module shown in FIG. 2.
Figure 5:
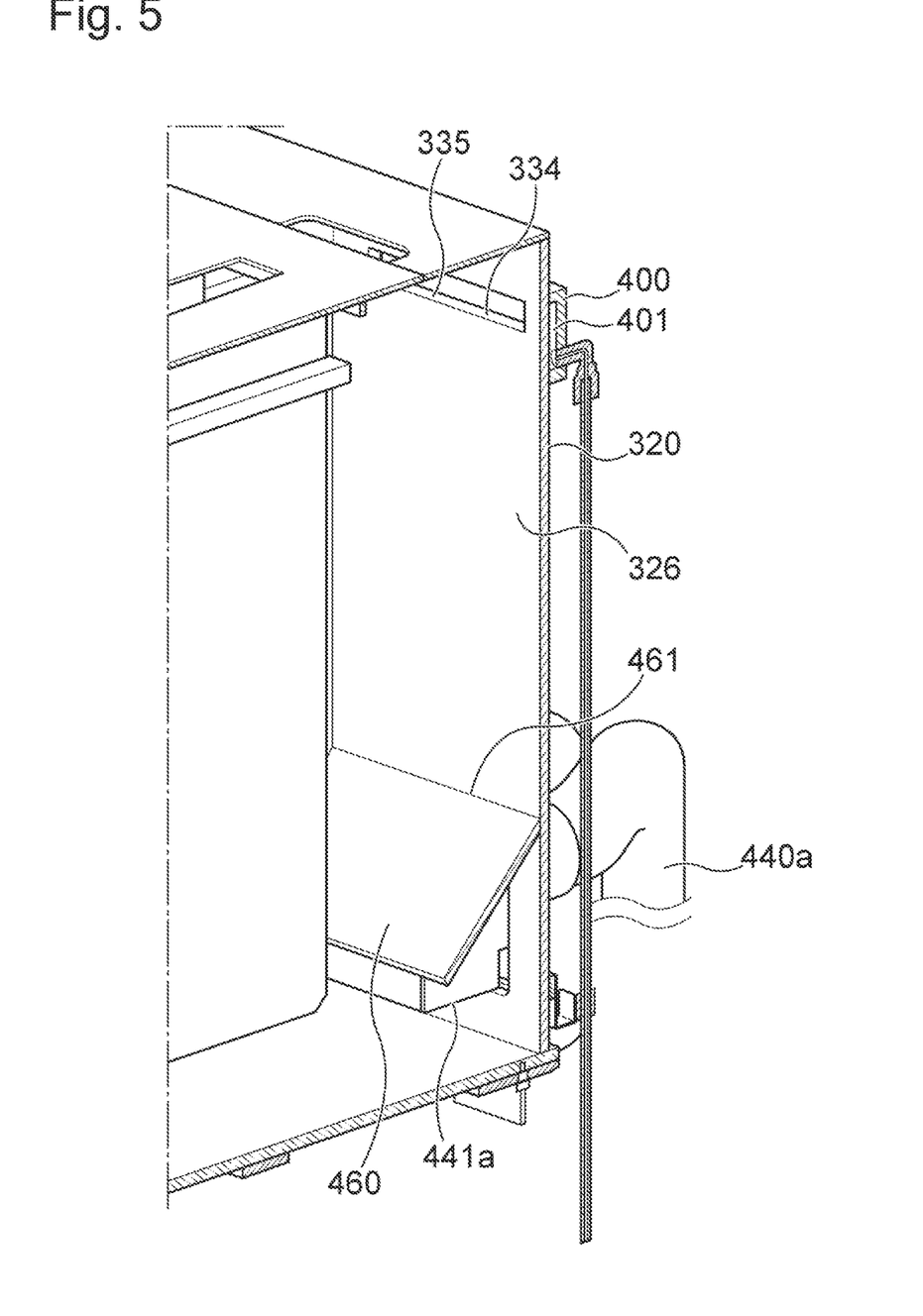
FIG. 5 is another cross-sectional perspective view illustrating the inside of the drying module shown in FIG. 2.

Also, as one example, the drying module 300 includes a plurality of nozzles 340 located in the inside of the drying tank 320 and two nozzle holding plates 420a, 420b (see FIGS. 3 and 4). The two nozzle holding plates 420a, 420b are located in the inside of the drying tank 320 and arranged in parallel with each other with a gap where the substrate holder 200 is arranged. Also, the two nozzle holding plates 420a, 420b are arranged in parallel with the two wall surfaces 330, 332 in parallel with each other of the four wall surfaces 326, 328, 330, 332. Moreover, one part of the plurality of nozzles 340 is attached to one nozzle holding plate 420a of the two nozzle holding plates 420a, 420b and the other part of the plurality of nozzles 340 is attached to the other nozzle holding plate 420b.

Also, the drying module 300 further includes a main gas supply tube 640, two branched gas supply tubes 660a, 660b, a gas heating module 540, two flowmeters 600 for measuring a flow rate of a gas and two gas adjusting valves 360 (see FIG. 3).

The main gas supply tube 640 constitutes a flow route from a gas supply source 900 external to the drying module 300 to a branch point 680. At the branch point 680, the main gas supply tube 640 is branched into the two branched gas supply tubes 660a, 660b. Each of the two branched gas supply tubes 660a, 660b constitutes a flow route from the branch point 680 to the corresponding nozzle 340 attached to the nozzle holding plates 420a, 420b. Also, the gas supply source 900 has a function of supplying a dry gas. In this embodiment, as one example, the gas supply source 900 has a function of supplying dry nitrogen, Due to this, each nozzle 340 can spray gas supplied from the gas supply source 900. Additionally, in another embodiment according to the present disclosure, the gas supply source 900 may supply a dry gas other than nitrogen.

Also, an injection port of each nozzle 340 is directed to the substrate holder 200 housed in the inside of the drying tank 320 or the substrate W held by the substrate holder 200. Consequently, each nozzle 340 can spray a gas to the substrate holder 200 or the substrate W housed in the drying tank 320, Due to spraying of the gas to the substrate holder 200 or the substrate W, the substrate holder 200 and the substrate W are dried.

Also, in this embodiment, at least part of the plurality of nozzles 340 are attached to the nozzle holding plates 420a, 420b through a swing joint 321 (see FIG. 4). Due to this, each nozzle 340 can spray the gas toward a place which is desired to be dried. Additionally, in another embodiment according to the present disclosure, the drying module 300 includes no nozzle holding plates 420a, 420b, and the plurality of nozzles 340 may be directly attached to the drying tank 320. Also, the plurality of nozzles 340 may be attached to the nozzle holding plates 420a, 420b not through the swing joint 321.

Also, to each of the two branched gas supply tubes 660a, 660b, the gas adjusting valve 360 for adjusting the flow rate of the gas ejected from the nozzle 340 and the flowmeter 600 are attached (see FIG. 3). Consequently, due to adjustment of the as adjusting valves 360, each nozzle 340 can spray gas at an appropriate flow rate.

Also, the gas heating module 540 is attached to the main gas supply tube 640. In other words, the gas heating module 540 is in fluid communication with the nozzle 340 and positioned at an upstream side of the nozzle 340. As one example, the gas heating module 540 is a heat exchanger, and has a function of heating the gas sprayed from the nozzle 340 to the inside of the drying tank 320. Consequently, each nozzle 340 can spray the gas heated by the gas heating module 540 to the substrate holder 200 or the substrate W and can dry the substrate holder 200 or the substrate W more rapidly. Additionally, in another embodiment according to the present disclosure, as one example, the gas heating module 540 may be configured such that the gas sprayed from the nozzle 340 to the inside of the drying tank 320 is heated to 50° C.

Additionally, in this embodiment, as one example, the main gas supply tube 640, the two branched gas supply tubes 660a, 660b and the two gas adjusting valves 360 are included in a gas supply system 310. However, in another embodiment according to the present disclosure, the gas supply system 310 does not necessarily include the main gas supply tube 640, the two branched gas supply tubes 660a, 660b and the two gas adjusting valves 360 as long as the gas supply system 310 has a configuration of supplying the gas to the plurality of nozzles 340.

Also, as one example, the drying module 300 further includes two cover members 400, a main liquid supply tube 720, two branched liquid supply tubes 700a, 700b, a liquid heating module 580, two flowmeters 620 for measuring a flow rate of liquid, two liquid adjusting valves 350 and liquid supply ports 334 (see FIG. 2). Moreover, the liquid supply ports 334 are formed at the two wall surfaces 326, 328 extending vertically to the two nozzle holding plates 420a, 420b of the four wall surfaces 326, 328, 330, 332 constituting the wall 322. Also, as one example, each liquid supply port 334 is an opening which is located at a higher position than the plurality of nozzles 340 and has a rectangular shape (see FIG. 5). Moreover, each liquid supply port 334 has a lower end 335 extending in a horizontal direction. Each cover member 400 is attached externally to the drying tank 320 to cover the corresponding liquid supply port 334. This forms a space 401 surrounded by the drying tank 320 and each cover member 400.

The main liquid supply tube 720 constitutes a flow route from a liquid supply source 920 external to the drying module 300 to a branch point 740 (see FIG. 2). At the branch point 740, the main liquid supply tube 720 is branched into the two branched liquid supply tubes 700a, 700b. The two branched liquid supply tubes 700a, 700b constitute a flow route from the branch point 740 to the corresponding space 401. Also, the liquid supply source 920 has a function of supplying liquid. In this embodiment, as one example, the liquid supply source 920 has a function of supplying water. Due to this, the liquid is supplied from the liquid supply source 920 to the space 401. As a result, the liquid flowing into the space 401 constitutes a puddle, and the liquid constituting the puddle passes through the liquid supply port 334 to be supplied to the inside of the drying tank 320. The liquid supplied to the inside of the drying tank 320 flows along an inner surface of the wall 322. In other words, the liquid supply port 334 supplies the liquid to the inner surface of the wall 322.

Also, to each of the two branched liquid supply tubes 700a, 700b, the liquid adjusting valves 350 and the flowmeter 620 are attached. Consequently, due to adjustment of the liquid adjusting valves 350, the flow rate of the liquid to be supplied to the space 401 is adjusted, and as a result, the flow rate of the liquid to be supplied to the inside of the drying tank 320 is adjusted.

Also, the liquid heating module 580 is attached to the main liquid supply tube 720. In other words, the liquid heating module 580 is in fluid communication with the liquid supply port 334 and positioned at an upstream side of the liquid supply port 334. As one example, the liquid heating module 580 is a heat exchanger, and has a function of heating liquid to be supplied from the liquid supply port 334 to the inside of the drying tank 320. Due to this, the heated liquid is supplied from the liquid supply port 334 to the inside of the drying tank 320. Consequently, a temperature of the inside of the drying tank 320 increases, which achieves an environment that the liquid is easily evaporated in the inside of the drying tank 320. As a result, at the time of operation of the drying module 300 which will be explained later, the drying module 300 can evaporate the liquid attached to the substrate W or the substrate holder 200 more rapidly. Additionally, in another embodiment according to the present disclosure, as one example, the liquid heating module 580 may be configured such that the liquid supplied to the inside of the drying tank 320 is heated to 50° C.

Additionally, in this embodiment, as one example, the two cover members 400, the main liquid supply tube 720, the two branched liquid supply tubes 700a, 700b and the two liquid adjusting valves 350 are included in a liquid supply system 312. However, in another embodiment according to the present disclosure, the liquid supply system 312 does not necessarily include the two cover members 400, the main liquid supply tube 720, the two branched liquid supply tubes 700a, 700h and the two liquid adjusting valves 350 as long as the liquid supply system 312 has a configuration of supplying the liquid from the liquid supply port 334 to the inside of the drying tank 320.

Also, as one example, the drying tank 320 includes two outlets 336 for discharging the liquid in the inside of the drying tank 320 at the bottom surface 324 (see FIG. 2). To each outlet 336, a drain piping 930 is connected, and the drain piping 930 is in fluid communication with a drainage section (not shown) in a plant where the plating apparatus 100 is installed. Due to this, the liquid supplied from the liquid supply port 334 to the inside of the drying tank 320 passes through the outlet 336 to be transferred to the drainage section in the plant.

Also, as one example, the drying module 300 further includes two first exhaust ducts 440a, 440b and two inclined plates 460 (see FIG. 2). Each of the first exhaust ducts 440a, 440b penetrates the wall 322 of the drying tank 320 and is in fluid communication with the inside of the drying tank 320. Also, the first exhaust ducts 440a, 440b include first exhaust ports 441a, 441b. The first exhaust ports 441a, 441b are positioned at a lower side than the liquid supply ports 334 at the wall 322 in the inside of the drying tank 320. Moreover, the first exhaust ducts 440a, 440b are connected to an exhaust section of the plant (not shown). Due to this, gas in the inside of the drying tank 320 passes through the first exhaust ports 441a, 441b to be discharged to the exhaust section of the plant.

Each inclined plate 460 has an end 461 which is fixed at an upper side than the first exhaust ports 441a, 441b of the wall 322 and inclined to be separated from the wall 322 toward a lower side of the drying tank 320. Due to this, the inclined plate 460 inhibits the liquid supplied from the liquid supply port 334 is splashed to the first exhaust ducts 440a, 440b, and as a result, inhibits pouring of the liquid to the first exhaust ports 441a, 441b.

Also, as shown in FIG. 1, the first exhaust ducts 440a, 440h partially extend along a direction that the processing tanks 180 are aligned at the side of each processing tank 180. Moreover, the first exhaust ducts 440a, 440h include a plurality of gas suction ports 442a, 442b. Due to this, the first exhaust ducts 440a, 440b can suction surrounding gas of the plating apparatus 100 through the plurality of gas suction ports 442a, 442b. In a case where processing is executed in the plating apparatus 100, particles are generated, and the particles max fly. Also, diffusion of gas in which plating liquid is evaporated in the plating tank 162 to atmospheric air is not preferable since the gas includes various components. However, these particles and evaporated gas are suctioned from the gas suction ports 442a, 442b to the first exhaust ducts 440a, 440b. In other words, the plating apparatus 100 can reduce diffusion of the particles and diffusion of the gas in which plating liquid is evaporated to the atmospheric air.

Also, the drying module 300 further includes a second exhaust duct 480, a roof 500 and an exhaust adjusting valve 520 (see FIG. 2). The second exhaust duct 480 penetrates the bottom surface 324 of the drying tank 320 and is in fluid communication with the inside of the drying tank 320. Also, the second exhaust duct 480 has a second exhaust port 481 which is positioned at the inside of the drying tank 320 to be open upward. Moreover, the second exhaust port 481 is located at a higher position than the outlets 336 to prevent the liquid from entering the second exhaust duct 480. The roof 500 is positioned at an upper side of the second exhaust port 481 to prevent entering of the liquid dropped from above the second exhaust port 481 into the second exhaust port 481. Also, as shown in FIG. 1, a part of the second exhaust duct 480 passes below the processing tank 180 to be connected to the exhaust section of the plant (not shown). Due to this, gas in the inside of the drying tank 320 passes through the second exhaust port 481 to be discharged to the exhaust section of the plant.

Also, in this embodiment, the second exhaust duct 480 is configured to suction gas from the second exhaust port 481 such that the inside of the drying tank 320 is −80 kPa or less. Consequently, at the time of operation of the drying module 300 which will be explained later, the drying module 300 allows the inside of the drying tank 320 to have a negative pressure of −80 kPa or less. Here, generally, liquid is evaporated more easily as an atmospheric pressure is decreased. Due to this, since the inside of the drying tank 320 is −80 kPa or less at the time of operation of the drying module 300, the substrate holder 200 and the substrate W are dried more rapidly. Additionally, in another embodiment according to the present disclosure, the second exhaust duct 480 may be configured to suction gas from the second exhaust port 481 such that the inside of the drying tank 320 has a negative pressure.

Also, the second exhaust duct 480 is not in fluid communication with the first exhaust ducts 440a, 440h at a downstream side of the second exhaust port 481. As described above, when the gas is supplied from the nozzle 340 to the drying tank 320, to allow the inside of the drying tank 320 to have the negative pressure to achieve the environment that the liquid easily evaporates in the inside of the drying tank 320, the gas in the inside of the drying tank 320 is suctioned from the second exhaust port 481. Consequently, a relatively large amount of gas is required to be suctioned from the second exhaust port 481 per unit time. On the other hand, the gas suction ports 442a, 442b are openings for suctioning the particles or the gas in which plating liquid is evaporated. Accordingly, the amount of the gas suctioned from the gas suction ports 442a, 442b per unit time does not need to be as large as that of the gas suctioned from the second exhaust port 481. Consequently, there is a case where the amount of the gas suctioned from the gas suction ports 442a, 442b is significantly different from the amount of the gas suctioned from the second exhaust port 481.

Here, in a case where the amount of gas suctioned from each opening of a single duct is significantly different, adjusting the suction amount of the gas from each opening is generally difficult. Consequently, if the second exhaust duct 480 is in fluid communication with the first exhaust ducts 440a, 440b at the downstream side of the second exhaust port 481, separately adjusting the amount of the gas suctioned from the second exhaust port 481 and the amount of the gas suctioned from the gas suction ports 442a, 442b is difficult. This may prevent suction of gas at an intended amount from the second exhaust port 481 and the gas suction ports 442a, 442b. However, in this embodiment, as described before, the second exhaust duct 480 is not in fluid communication with the first exhaust ducts 440a, 440h at the downstream side of the second exhaust port 481. Consequently, an operator allows the second exhaust port 481 and the gas suction ports 442a, 442b to suction of gas at the intended flow rate.

Also, the exhaust adjusting valve 520 having a function of adjusting a flow rate of the gas to be suctioned by the second exhaust port 481 is attached to the second exhaust duct 480 (see FIG. 2). Consequently, the operator allows for suctioning of the gas from the second exhaust port 481 only when needed.

Also, each outlet 336 is located at a position close to the second exhaust port 481 such that, when the gas is suctioned from the second exhaust port 481, the liquid drawn to the second exhaust port 481 can be discharged (see FIG. 2). Due to this, the liquid supplied from the liquid supply port 334 to the inside of the drying tank 320 is easily discharged from the outlet 336, and the puddle is difficult to be made at the bottom surface 324 of the drying tank 320. This is because, when the gas is suctioned from the second exhaust port 481, the liquid in the inside of the drying tank 320 is drawn to the second exhaust port 481, and this liquid is discharged from the outlet 336.

Also, as one example, the first exhaust ducts 440a, 440b include manual adjusting valves 443a, 443b. Due to this, the operator can adjust the flow rate of the gas suctioned by the first exhaust ports 441a, 441b by adjusting the adjusting valves 443a, 443b. As a result, when the gas in the inside of the drying tank 320 is discharged from both the first exhaust ports 441a, 441b and the second exhaust port 481, the operator can adjust a balance between the amount of the gas discharged from the first exhaust ports 441a, 441b and the amount of the gas discharged from the second exhaust port 481.

Also, the drying module 300 further includes two heating devices 560 for heating the gas in the inside of the drying tank 320 (see FIG. 3). The heating devices 560, as one example, are heat exchanger plates, and respectively arranged between the nozzle holding plates 420a, 420b and the wall surfaces 330, 332. Due to this, at the time of operation of the drying module 300 which will be explained later, the heating device 560 can heat the gas in the inside of the drying tank 320 to achieve the environment that the liquid easily evaporates in the inside of the drying tank 320. As a result, at the operation of the drying module 300 which will be explained later, the drying module 300 can evaporate the liquid attached to the substrate W and the substrate holder 200 more rapidly. Additionally, in another embodiment according to the present disclosure, as one example, the heating device 560 may be configured such that the gas in the inside of the drying tank 320 is heated to 50° C.

Also, the drying module 300 includes a control module 380 for controlling the gas supply system 310, the liquid supply system 312 and the exhaust adjusting valve 520. More specifically, the control module 380 controls the liquid adjusting valves 350 included in the liquid supply system 312 and the gas adjusting valves 360 included in the gas supply system 310.

Figure 6:
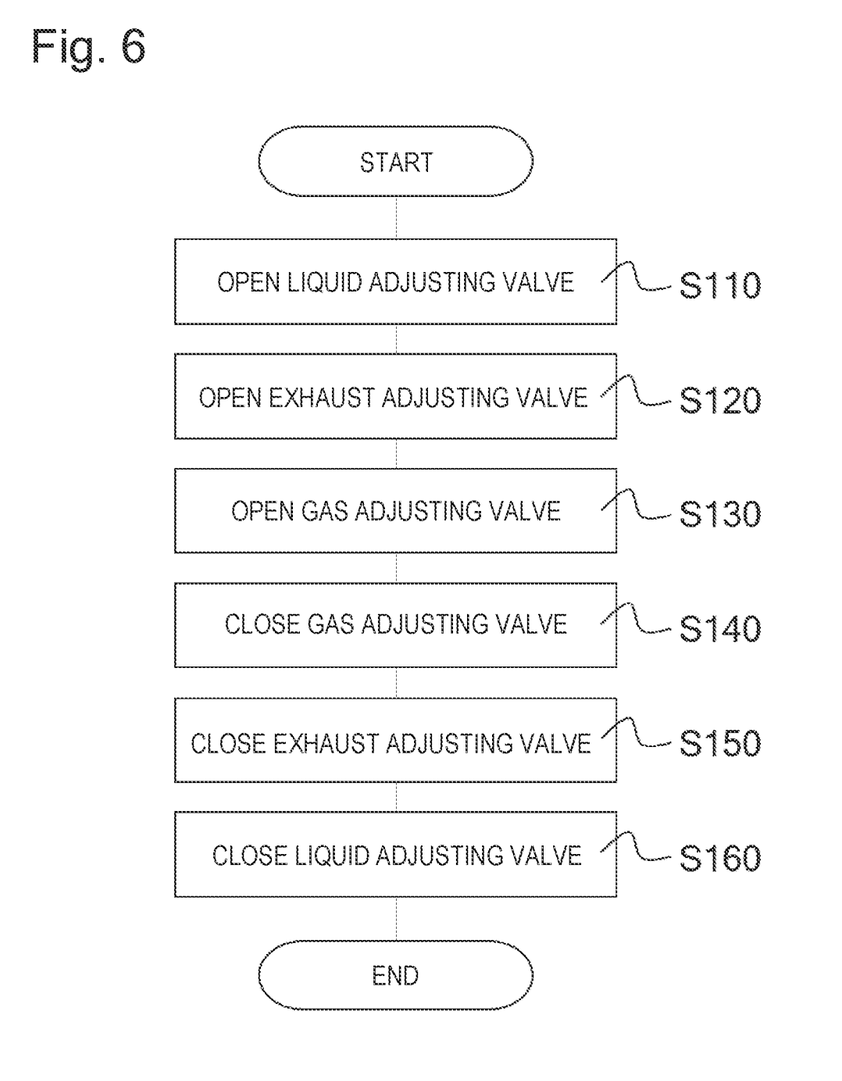
FIG. 6 is a flow chart showing a procedure of a control process at the time of operation of the drying module shown in FIG. 2.

Next, with reference to FIG. 6, an operation of the drying module 300 from a state that the substrate holder 200 is not housed in the inside of the drying tank 320 (an initial state) will explained. Here, FIG. 6 is a flow chart showing a procedure of a control process at the time of operation of the drying module 300. Additionally, in the initial state, the liquid adjusting valves 350, the gas adjusting valves 360 and the exhaust adjusting valve 520 are closed.

When cleaning of the surface of the substrate W is completed by a known method in the second cleaner 130b of the plating apparatus 100, the second transporter 194h holds and transfer the substrate holder 200 from the second cleaner 130b to the drying tank 320 (see FIG. 1). At this time, the substrate holder 200 is inserted into the inside of the drying tank 320 in a suspended state from the opening 338 of the upper surface 337 of the drying tank 320. Moreover, the substrate holder 200 is disposed at a predetermined position of the drying tank 320. Thereafter, the drying module 300 starts operation when it detects that the substrate holder 200 is disposed.

First, in step S110, the control module 380 opens the liquid adjusting valves 350. Due to this, liquid is supplied to the space 401. Moreover, the liquid flowing to the space 401 constitutes a puddle, and the liquid constituting the puddle passes through the liquid supply ports 334 and is supplied to the inside of the drying tank 320.

Next, in step S120, the control module 380 opens the exhaust adjusting valve 520. Due to this, gas in the inside of the drying tank 320 is suctioned from the second exhaust port 481 to the second exhaust duct 480. As a result, as described above, the atmospheric pressure of the inside of the drying tank 320 is decreased, and the drying module 300 can dry the substrate holder 200 and the substrate W more rapidly.

Next, in step S130, the control module 380 opens the gas adjusting valves 360. Due to this, each nozzle 340 sprays the gas toward the substrate holder 200 or the substrate W to dry the substrate holder 200 and the substrate W.

Next, in step S140, the control module 380 closes the gas adjusting valves 360. Due to this, spraying of the gas by the plurality of nozzles 340 is stopped.

Nest, in step S150, the control module 380 closes the exhaust adjusting valve 520.

Next, in step S160, the control module 380 closes the liquid adjusting valves 350, Due to this, supply of the liquid from the liquid supply ports 334 to the drying tank 320 is stopped. This is the explanation of the operation of the drying module 300.

As clear from the explanation of the operation of the drying module 300, the control module 380 controls the liquid supply system 312 and the gas supply system 310 such that the plurality of nozzles 340 spray the gas to the substrate holder 200 or the substrate W while the liquid supply ports 334 supply the liquid to the inner surface of the wall 322. In other words, in the drying module 300, when each nozzle 340 spays the gas to the substrate holder 200 or the substrate W, the liquid is supplied from the liquid supply ports 334 to the inner surface of the wall 322 in the inside of the drying tank 320. Consequently, even if the particles attached to the substrate holder 200 or the substrate W fly when the nozzle 340 sprays the gas, the liquid supplied from the liquid supply ports 334 contacts the gas in the inside of the drying tank 320, the particles floating in the gas can be captured. As a result, in the drying module 300, attachment of the particles to the inside of the drying tank 320 is inhibited, and contamination of the inside of the drying tank 320 due to the particles is inhibited. Also, due to inhibition of the attachment of the particles to the inside of the drying tank 320, the particles attached to the inside of the drying tank 320 are inhibited from flying again to be attached to another substrate W or substrate holder 200.

Also, generally, when the particles included in a gas are attached to a wall surface, the particles may accumulate on the wall surface. Further, there is a case that, when the particles are strongly attached to the wall surface, the attached particles are difficult to be rinsed off by liquid. On the contrary, in the drying module 300, the liquid constituting the puddle is supplied to the inside of the drying tank 320 such that it outpours from the liquid supply ports 334. At this time, since each liquid supply port 334 includes the lower end 335 extending in the horizontal direction (see FIG. 5), the liquid supplied to the inside of the drying tank 320 flows along the wall surfaces 326, 328 of the drying tank 320 like a waterfall having a certain degree of width. Due to this, the liquid inhibits the gas including the particles from contacting the wall surfaces 326, 328 of the drying tank 320. In other words, the drying module 300 can inhibit attachment of the particles included in the gas to the wall surfaces 326, 328 and accumulation of the particles to the wall surfaces 326, 328.

Also, FIG. 7 is a cross-sectional view showing the inside of the drying tank 320 according to another embodiment of the present disclosure. As described above, the liquid supply ports 334 shown in FIG. 2 are the openings formed on the wall 322. On the other hand, the liquid supply ports 334 shown in FIG. 7 are injection ports of liquid supply nozzles 333 provided to face the inner surfaces of the wall 322. Also in this case, each liquid supply port 334 can supply liquid to the inner surface of the wall 322, and can form a liquid film on the inner surface. Moreover, the drying module 300 can inhibit attachment of the particles to the inside of the drying tank 320, and can inhibit that the particles attached to the inside of the drying tank 320 fly again to be attached to another substrate W or substrate holder 200.

Also, the drying module 300 includes the opening 338. Consequently, when the nozzle 340 sprays the gas, the gas in the inside of the drying tank 320 is discharged from the opening 338 to the outside. Consequently, if the particles are not removed when the nozzle 340 sprays the gas, more particles fly from the opening 338 to the outside of the drying tank 320, which may cause contamination at the periphery of the drying tank 320. However, as descried above, in the drying module 300, the particles are removed when the nozzle 340 sprays the gas. As a result, the amount of the particles frying from the opening 338 to the outside of the drying tank 320 is reduced.

Also, as described above, in the drying module 300, the plurality of nozzles 340 are attached to the two nozzle holding plates 420a, 420b, and each nozzle 340 sprays the gas toward the substrate holder 200 or the substrate W arranged between the two nozzle holding plates 420a, 420b. Consequently, the gas sprayed from the plurality of nozzles 340 passes between the two nozzle holding plates 420a, 420b and outflows in a direction that plate surfaces of the nozzle holding plates 420a, 420b extend. Moreover, at a destination of the outflowing gas, the two wall surfaces 326, 328 extending vertically to the nozzle holding plates 420a, 420b are positioned. To the two wall surfaces 326, 328, the liquid supply ports 334 are formed. In other words, to a portion where the liquid is supplied to the drying tank 320, the gas which outflows passing between the two nozzle holding plates 420a, 420b is sprayed vigorously. Due to this, more gas contacts the liquid, and more particles floating in the gas can be removed by the liquid.

Also, the liquid supply ports 334 are located at a higher position than the plurality of nozzles 340. Consequently, the liquid moves in a wider range of the inside of the drying tank 320 compared with a case where the liquid supply ports 334 are located at a lower position than the plurality of nozzles 340. As a result, more gas can contact the liquid, and more particles floating in the gas can be removed by the liquid.

Also, in the drying module 300, the exhaust adjusting valve 520 is opened when the liquid attached to the substrate W or the substrate holder 200 is dried, and the exhaust adjusting valve 520 is closed in the other cases. Consequently, the gas in the inside of the drying tank 320 is suctioned from the second exhaust port 481 to the second exhaust duct 480 only when needed, which eliminates necessity of constantly discharging a huge gas from the drying tank 320, and thus the drying module 300 can inhibit the used amount of a utility.

Also, the drying module 300 may dry only the substrate holder 200 not holding the substrate W. Further, in another embodiment, the drying module 300 may cleanse only the substrate holder 200 not holding the substrate W in the inside of the drying tank 320 and then dry the substrate holder 200, or may dry the substrate holder 200 cleansed in a substrate holder cleansing module which is additionally provided.

[Supplement]

While the above-described embodiments may be partially or entirely described as in Supplements below, they are not limited to the followings.

(Supplement 1)

A drying module according to Supplement 1 is a drying module for drying a substrate holder, the drying module including: a drying tank configured to house the substrate holder and having a wall and an outlet which discharges liquid in an inside of the drying tank; a liquid supply port for supplying the liquid to an inner surface of the wall; a plurality of nozzles which are located in the inside of the drying tank to spray a gas to the substrate holder housed in the drying tank; a liquid supply system which supplies the liquid from the liquid supply port to the inside of the drying tank; a gas supply system which supplies the gas to the plurality of nozzles; and a control module, wherein the control module controls the liquid supply system and the gas supply system such that the plurality of nozzles spray the gas to the substrate holder or a substrate while the liquid supply port supplies the liquid to the inner surface of the wall.

In a case where the nozzles spray gas to the substrate holder to dry the substrate holder in the inside of the drying tank, the particles attached to the substrate holder or the substrate held by the substrate holder fly to be attached to an inner surface of the drying tank, which may cause contamination of the inside of the drying tank. Moreover, when the nozzles dry the substrate holder in the inside of the contaminated drying tank, the particles attached to the inner surface fly again, which may cause contamination of the substrate holder and the substrate.

On the other hand, in the drying module according to Supplement 1, the control module controls the liquid supply system and the gas supply system such that the plurality of nozzles spray the gas to the substrate holder while the liquid supply port supplies the liquid to the inner surface of the wall. In other words, such a state is inevitably achieved that the liquid is supplied from the liquid supply port to the inner surface of the wall of the inside of the drying tank when the plurality of nozzles spray the gas to the substrate holder. The liquid can capture the particles floating in the gas by contacting the gas in the inside of the drying tank, which inhibits contamination of the inside of the drying tank. In other words, in the drying module according to Supplement 1, the particles floating in the inside of the drying tank can be removed when the substrate holder is dried, which can inhibit that the particles attached to the inner surface of the drying tank fly again to be attached to another substrate or the substrate holder.

(Supplement 2)

A drying module according to Supplement 2 is the drying module according to Supplement 1, wherein the liquid supply port is formed at the wall and has a lower end extending in a horizontal direction, the liquid supply system includes a cover member to be attached at an outer side of the drying tank to cover the liquid supply port, a space surrounded by the drying tank and the cover member is formed, the liquid flowing in the space constitutes a puddle, and the liquid constituting the puddle passes the liquid supply port to be supplied to the inside of the drying tank.

When the particles included in a gas are attached to a wall surface, the particles may accumulate on the wall surface. Further, there is a case that, when the particles are strongly attached to the wall surface, the attached particles are difficult to be rinsed off by liquid.

On the contrary, according to the drying module according to Supplement 2, the liquid constituting the puddle is supplied to the inside of the drying tank such that it outpours from the liquid supply port. At this time, since the liquid supply port includes the lower end extending in the horizontal direction, the liquid supplied to the inside of the drying tank flows along the wall surfaces of the drying tank like the waterfall having a certain degree of width. Due to this, the liquid inhibits the gas including the particles from contacting the wall surfaces of the drying tank. In other words, the drying module can inhibit attachment of the particles included in the gas to the wall surfaces and accumulation of the particles to the wall surfaces.

(Supplement 3)

A drying module according to Supplement 3 is the drying module according to Supplement 1 or 2, Wherein the drying tank includes an upper surface having an opening for inserting the substrate holder into the inside.

In the drying module according to Supplement 3, the substrate holder can be inserted in the inside of the drying tank from the opening at the upper surface of the drying tank. Here, in a case where the drying module includes the opening, when the gas is sprayed, the particles attached to the substrate holder or the substrate fly from the opening, which may cause contamination at the periphery of the drying tank. On the other hand, in the drying module according to Supplement 3, the liquid is supplied from the liquid supply port to the inside of the drying tank when the nozzles spray the gas to the substrate holder. Consequently, the particles in the inside of the drying tank are removed by the liquid when the gas is sprayed to the substrate holder. In other words, the drying module can reduce the amount of the particles frying from the opening to the outside of the drying tank.

(Supplement 4)

A drying module according to Supplement 4 is the drying module according to any one of Supplements 1 to 3, further including two nozzle holding plates which are located in the inside of the drying tank and arranged in parallel with each other with a gap where the substrate holder is arranged, the wall includes four wall surfaces forming a rectangular shape in a top view, the two nozzle holding plates are arranged in parallel with the two wall surfaces in parallel with each other of the four wall surfaces, one part of the plurality of nozzles is attached to one of the two nozzle holding plates, the other part of the plurality of nozzles is attached to the other of the two nozzle holding plates, and the liquid supply port is formed at two wall surfaces extending vertically to the nozzle holding plate of the four wall surfaces.

In the drying module according to Supplement 4, the gas sprayed from the plurality of nozzles passes between the two nozzle holding plates and outflows in a direction that plate surfaces of the nozzle holding plates extend. Moreover, at the destination of the outflowing gas, the two wall surfaces extending vertically to the nozzle holding plates are positioned. To the two wall surfaces, the liquid supply ports are respectively formed. In other words, to the portion where the liquid is supplied to the drying tank, the gas which outflows passing between the two nozzle holding plates is sprayed vigorously. Due to this, more gas contacts the liquid, and more particles floating in the gas can be removed by the liquid.

(Supplement 5)

A drying module according to Supplement 5 is the drying module according to any one of Supplements 1 to 4, wherein the liquid supply port is located at a higher position than the plurality of nozzles.

The liquid supplied from the liquid supply port to the inside of the drying tank flows from an upper side to the lower side of the drying tank according to gravity. According to the drying module according to Supplement 5, the liquid supply port is located at the higher position than the plurality of nozzles. Consequently, the liquid moves in the wider range of the inside of the drying tank compared with a case where the liquid supply port is located at a lower position than the plurality of nozzles. Due to this, more gas can contact the liquid, and more particles floating in the gas can be removed by the liquid.

(Supplement 6)

A drying module according to Supplement 6 is the drying module according to any one of Supplements 1 to 5, further including a first exhaust duct including a first exhaust port which is positioned at a lower side than the liquid supply port to discharge gas in the inside of the drying tank, and an inclined plate which has an end fixed at an upper side than the first exhaust port of the wall and which is inclined to be separated from the wall toward a lower side of the drying tank.

In the drying module according to Supplement 6, the first exhaust port can discharge the gas sprayed by the nozzles. Also, the inclined plate can inhibit pouring of the liquid supplied from the liquid supply port, to the first exhaust ports.

(Supplement 7)

A drying module according to Supplement 7 is the drying module according to any one of Supplements 1 to 6, further including a second exhaust duct which has a second exhaust port for suctioning gas in the inside of the drying tank such that the inside of the drying tank has a negative pressure.

Generally, liquid is evaporated more easily as an atmospheric pressure is decreased. The drying module according to Supplement 7 allows the inside of the drying tank to have a negative pressure. Due to this, the drying module can dry the substrate holder or the substrate held by the substrate holder more rapidly.

(Supplement 8)

A drying module according to Supplement 8 is the drying module according to Supplement 7, wherein the gas in the inside of the drying tank is suctioned by the second exhaust port such that the inside of the drying tank has −80 kPa or less.

In the drying module according to Supplement 8, the inside of the drying tank can have −80 kPa or less. Due to this, the drying module can dry the substrate holder or the substrate held by the substrate holder more rapidly than a drying module which allows the inside of the drying tank to have merely a negative pressure near 0 kPa.

(Supplement 9)

A drying module according to Supplement 9 is the drying module according to Supplement 7 or 8, wherein the second exhaust duct penetrates a bottom surface of the drying tank and is in fluid communication with the inside of the drying tank.

In a case where the exhaust duct penetrates a lateral side of the drying tank and is in fluid communication with the inside of the drying tank, a space where the exhaust duct is arranged is needed at the side of the drying tank, which may increase a footprint of the drying module. However, in the drying module according to Supplement 9, the second exhaust duct penetrates the bottom surface, so that the space where the exhaust duct is arranged is unnecessary at the side of the drying tank, which prevents increase of the footprint.

(Supplement 10)

A drying module according to Supplement 10 is the drying module according to Supplement 9, wherein the second exhaust port is located at a higher position than the outlet, and a roof is provided at an upper side of the second exhaust port.

According to the drying module according to Supplement 10, the second exhaust port is located at a higher position than the outlet for discharging the liquid in the inside of the drying tank, which prevents the liquid from entering the second exhaust port. Also, the roof is provided at the upper side of the second exhaust port, which prevents entering of the liquid dropping from above the second exhaust port into the second exhaust port.

(Supplement 11)

A drying module according to Supplement 11 is the drying module according to any one of Supplements 7 to 10, further including an exhaust adjusting valve for adjusting a flow rate of the gas to be suctioned by the second exhaust port.

In the drying module according to Supplement 11, since the exhaust adjusting valve is opened and closed, the operator can discharge the gas in the inside of the drying tank from the second exhaust port to the outside only when needed.

(Supplement 12)

A drying module according to Supplement 12 is the drying module according to Supplement 10 or 11, wherein the outlet is formed at a bottom surface of the drying tank and is located at a position close to the second exhaust port such that, when the gas is suctioned from the second exhaust port, the liquid drawn to the second exhaust port can be discharged.

In the drying module according to Supplement 12, when the gas is suctioned from the second exhaust port, the liquid in the inside of the drying tank is drawn to the second exhaust port. Moreover, the outlet is located at the position such that the liquid drawn to the second exhaust port can be discharged. Due to this, the liquid supplied from the liquid supply port to the inside of the drying tank is easily discharged from the outlet, and the puddle is difficult to be made at the bottom surface of the drying tank.

(Supplement 13)

A drying module according to Supplement 13 is the drying module according to any one of Supplements 1 to 12, further including a gas heating module which is in fluid communication with the nozzle and positioned at an upstream side of the nozzle.

In the drying module according to Supplement 13, the nozzle can spray the gas heated by the gas heating module to the substrate holder. Consequently, the substrate holder can be dried more rapidly.

(Supplement 14)

A drying module according to Supplement 14 is the drying module according to any one of Supplements 1 to 13, further including a heating device for heating a gas in the inside of the drying tank.

In the drying module according to Supplement 14, since the gas in the inside of the drying tank is heated, a temperature of the inside of the drying tank increases, so that the liquid in the inside of the drying tank can be evaporated more rapidly. Consequently, this substrate holder collecting module can dry the substrate holder or the substrate housed in the drying tank more rapidly.

(Supplement 15)

A drying module according to Supplement 15 is the drying module according to any one of Supplements 1 to 14, further including a liquid heating module which is in fluid communication with the liquid supply port and positioned at an upstream side of the liquid supply port.

In the drying module according to Supplement 15, the heated liquid is supplied from the liquid supply port to the inside of the drying tank. Consequently, a temperature of the inside of the drying tank increases, so that the liquid attached to the substrate or the substrate holder in the inside of the drying tank is evaporated more rapidly. In other words, in the drying module, the substrate holder or the substrate housed in the drying tank can be dried more rapidly.

(Supplement 16)

A substrate processing module according to Supplement 16 includes the drying module according to any one of Supplements 1 to 15.

The substrate processing module according to Supplement 16 can dry the substrate holder using the drying module. Also, as described before, this drying module can remove the particles floating in the gas when the substrate holder is dried.

(Supplement 17)

A substrate processing module according to Supplement 17 is the substrate processing module according to Supplement 16 depending from Supplements 6 and 7, including a plating tank for retaining plating liquid, and the first exhaust duct includes a plurality of gas suction ports and surrounding gas of the substrate processing module is suctioned from the plurality of gas suction ports.

When processing is executed in the substrate processing module, particles are generated, and the particles may fly. Also, diffusion of gas in which plating liquid is evaporated in the plating tank to atmospheric air is not preferable since the gas includes various components.

In the substrate processing module according to Supplement 17, the surrounding gas of the substrate processing module is suctioned from the plurality of gas suction ports. In other words, the particles and the gas in which plating liquid is evaporated are suctioned from the plurality of gas suction ports. As a result, this substrate processing module can reduce flying of the particles and diffusion of the gas in which plating liquid is evaporated to the atmospheric air.

(Supplement 18)

A substrate processing module according to Supplement 18 is the substrate processing module according to Supplement 17, wherein the second exhaust duct is not in fluid communication with the first exhaust duct at a downstream side of the second exhaust port.

The second exhaust port of the second exhaust duct suctions the gas in the inside of the drying tank to allow the inside of the drying tank to have the negative pressure to achieve the environment that the liquid easily evaporates in the inside of the drying tank. Moreover, the gas is supplied to the drying tank from the nozzles. Consequently, a relatively large amount of gas is required to be suctioned from the second exhaust port per unit time. On the other hand, the gas suction ports are openings for suctioning the particles or the gas in which plating liquid is evaporated. Accordingly, the amount of the gas suctioned from the gas suction ports per unit time does not need to be as large as that of the gas suctioned from the second exhaust port, and in some cases, there is a case where the amount of the gas suctioned from the gas suction ports is significantly different from the amount of the gas suctioned from the second exhaust port.

Here, in a case where the amount of gas suctioned from each opening of a single duct is significantly different, adjusting the suction amount of the gas from each opening is generally difficult. Consequently, if the second exhaust duct is in fluid communication with the first exhaust ducts at the downstream side of the second exhaust port, separately adjusting the amount of the gas suctioned from the second exhaust port and the amount of the gas suctioned from the gas suction ports is difficult. This may prevent suction of gas from each opening at an intended flow rate. However, in the substrate processing module according to Supplement 18, the second exhaust duct is not in fluid communication with the first exhaust ducts at the downstream side of the second exhaust port. Consequently, the substrate processing module allows the second exhaust port and the gas suction ports to suction gas at the intended flow rate.

(Supplement 19)

A method of drying the substrate holder according to Supplement 19 is a method of drying a substrate holder, the method including: a step of spraying gas to a substrate holder housed in a drying tank by a plurality of nozzles; and a step of supplying liquid to an inner surface of a wall in an inside of the drying tank from a liquid supply port, wherein the step of spraying is executed while the step of supplying liquid is executed.

According to the method of drying the substrate holder according to Supplement 19, the step of spraying is executed while the step of supplying liquid is executed. In other words, such a state is inevitably achieved that the liquid is supplied from the liquid supply port to the inner surface of the wall of the inside of the drying tank when the plurality of nozzles spray the gas to the substrate holder. The liquid can capture the particles floating in the gas by contacting the gas in the inside of the drying tank, which inhibits contamination of the inside of the drying tank. Ire other words, in the method of drying the substrate holder according to Supplement 19, the particles floating in the inside of the drying tank can be removed when the substrate holder is dried, which can inhibit that the particles attached to the inner surface of the drying tank fly again to be attached to another substrate or substrate holder.

As described above, while only some embodiments according to the present invention have been explained, those skilled in the art, can easily understand that various modifications or improvements can be added to the illustrated embodiments without substantially departing from a new teaching or benefit of the present invention. Accordingly, a form added such modifications or improvements is intended to be included in the technical scope of the present invention. Also, these embodiments may be arbitrarily combined.

REFERENCE SIGNS LIST

100: plating apparatus
162: plating tank
200: substrate holder
300: drying module
310: gas supply system
312: liquid supply system
320: drying tank
322: wall
324: bottom surface
326, 328, 330, 332: wall surfaces
334: liquid supply port
335: lower end
336: outlet
337: upper surface
338: opening
340: nozzle
350: liquid adjusting valve
360: gas adjusting valve
380: control module
400: cover member
401: space
420a, 420b: nozzle holding plates
422: wall
440a, 440h: first exhaust ducts
441a, 441h: first exhaust ports
442a, 442b: gas suction ports
460: inclined plate
461: end
480: second exhaust duct
481: second exhaust port
500: roof
520: exhaust adjusting valve
540: gas heating module
560: heating device
580: liquid heating module
W: substrate

What is claimed is:

1. A drying module for drying a substrate holder, the drying module comprising:

a drying tank configured to house the substrate holder and having a wall and an outlet which discharges liquid in an inside of the drying tank;
a liquid supply port for supplying the liquid to an inner surface of the wall;
a plurality of nozzles which are located in the inside of the drying tank to spray a gas to the substrate holder housed in the drying tank;
a liquid supply system which supplies the liquid from the liquid supply port to the inside of the drying tank;
a gas supply system which supplies the gas to the plurality of nozzles; and
a control module,
wherein the control module controls the liquid supply system and the gas supply system such that the plurality of nozzles spray the gas to the substrate holder or a substrate while the liquid supply port supplies the liquid to the inner surface of the wall.

2. The drying module according to claim 1, wherein the liquid supply port is formed at the wall and has a lower end extending in a horizontal direction,
the liquid supply system includes a cover member to be attached at an outer side of the drying tank to cover the liquid supply port,
a space surrounded by the drying tank and the cover member is formed, the liquid flowing in the space constitutes a puddle, and the liquid constituting the puddle passes the liquid supply port to be supplied to the inside of the drying tank.

3. The drying module according to claim 1, wherein the drying tank includes an upper surface having an opening for inserting the substrate holder into the inside.

4. The drying module according to claim 1, further comprising two nozzle holding plates which are located in the inside of the drying tank and arranged in parallel with each other with a gap where the substrate holder is arranged, wherein
the wall includes four wall surfaces forming a rectangular shape in a top view,
the two nozzle holding plates are arranged in parallel with the two wall surfaces in parallel with each other of the four wall surfaces,
one part of the plurality of nozzles is attached to one of the two nozzle holding plates,
the other part of the plurality of nozzles is attached to the other of the two nozzle holding plates, and
the liquid supply port is respectively formed at two wall surfaces extending vertically to the nozzle holding plate of the four wall surfaces.

5. The drying module according to claim 1, wherein the liquid supply port is located at a higher position than the plurality of nozzles.

6. The drying module according to claim 1, further comprising:
a first exhaust duct including a first exhaust port to discharge gas in the inside of the drying tank; and
an inclined plate which has an end fixed at an upper side than the first exhaust port of the wall and which is inclined to be separated from the wall toward a lower side of the drying tank.

7. The drying module according to claim 1, further comprising a second exhaust duct which has a second exhaust port for suctioning gas in the inside of the drying tank such that the inside of the drying tank has a negative pressure.

8. The drying module according to claim 7, wherein the gas in the inside of the drying tank is suctioned by the second exhaust port such that the inside of the drying tank has −80 kPa or less.

9. The drying module according to claim 7, wherein the second exhaust duct penetrates a bottom surface of the drying tank and is in fluid communication with the inside of the drying tank.

10. The drying module according to claim 9, wherein
a roof is provided at an upper side of the second exhaust port.

11. The drying module according to claim 7, further comprising an exhaust adjusting valve for adjusting a flow rate of the gas to be suctioned by the second exhaust port.

12. The drying module according to claim 7, wherein the outlet is formed at a bottom surface of the drying tank and is located at a position adjacent to the second exhaust port such that, when the gas is suctioned from the second exhaust port, the liquid drawn to the second exhaust port can be discharged.

13. The drying module according to claim 1, wherein the plurality of nozzles comprises a nozzle, and wherein the drying module further comprises a gas heating module which is in fluid communication with the nozzle and positioned at an upstream side of the nozzle.

14. The drying module according to claim 1, further comprising a heating device for heating a gas in the inside of the drying tank.

15. The drying module according to claim 1, further comprising a liquid heating module which is in fluid communication with the liquid supply port and positioned at an upstream side of the liquid supply port.

16. A substrate processing module comprising the drying module according to claim 1.

17. The substrate processing module according to claim 16, wherein
the drying module further comprises a first exhaust duct including a first exhaust port to discharge gas in the inside of the drying tank,
the substrate processing module includes a plating tank for retaining plating liquid,
the first exhaust duct includes a plurality of gas suction ports, and
surrounding gas of the substrate processing module is suctioned from the plurality of gas suction ports.

18. The substrate processing module according to claim 17, wherein
the drying module further comprises a second exhaust duct including a second exhaust port for suctioning the gas in the inside of the drying tank such that the inside of the drying tank has a negative pressure, and
the second exhaust duct is not in fluid communication with the first exhaust duct at a downstream side of the second exhaust port.

19. A method of drying a substrate holder, comprising:
a step of spraying gas to a substrate holder housed in a drying tank by a plurality of nozzles; and
a step of supplying liquid to an inner surface of a wall in an inside of the drying tank from a liquid supply port,
wherein the step of spraying is executed while the step of supplying liquid is executed.

* * * * *